US012790688B2

(12) United States Patent
Watabe et al.

(10) Patent No.: US 12,790,688 B2
(45) Date of Patent: Nov. 10, 2026

(54) METHOD OF PRODUCING RAW MATERIAL SOLUTION, METHOD OF FILM-FORMING AND PRODUCTION LOT

(71) Applicants: SHIN-ETSU CHEMICAL CO., LTD., Tokyo (JP); WAKAYAMA UNIVERSITY, Wakayama (JP)

(72) Inventors: Takenori Watabe, Annaka (JP); Hiroshi Hashigami, Annaka (JP); Takahiro Sakatsume, Takasaki (JP); Kazuyuki Uno, Izumi (JP); Marika Ohta, Fukuyama (JP)

(73) Assignees: SHIN-ETSU CHEMICAL CO., LTD., Tokyo (JP); WAKAYAMA UNIVERSITY, Wakayama (JP)

( * ) Notice: Subject to any disclaimer, the term of this patent is extended or adjusted under 35 U.S.C. 154(b) by 345 days.

(21) Appl. No.: 18/288,845

(22) PCT Filed: Mar. 30, 2022

(86) PCT No.: PCT/JP2022/015869
§ 371 (c)(1),
(2) Date: Oct. 30, 2023

(87) PCT Pub. No.: WO2022/234750
PCT Pub. Date: Nov. 10, 2022

(65) Prior Publication Data
US 2024/0124974 A1 Apr. 18, 2024

(30) Foreign Application Priority Data
May 4, 2021 (JP) ................................ 2021-078230

(51) Int. Cl.
*H01L 21/00* (2006.01)
*C23C 16/40* (2006.01)
(Continued)

(52) U.S. Cl.
CPC .......... *C23C 16/4486* (2013.01); *C23C 16/40* (2013.01); *C23C 16/403* (2013.01);
(Continued)

(58) Field of Classification Search
CPC ... C23C 16/4486; C23C 16/40; C23C 16/403; C23C 16/448; C23C 16/455;
(Continued)

(56) References Cited

U.S. PATENT DOCUMENTS 5,433,170 A 7/1995 Toda et al.
5,919,522 A 7/1999 Baum et al.
(Continued)

FOREIGN PATENT DOCUMENTS

CN 105386008 A 3/2016
CN 111939852 A 11/2020
(Continued)

OTHER PUBLICATIONS

Oh Keun-Tae et al: "Facile synthesis of 1.1 AlOxdielectrics via mist-CVD based on aqueous solutions", Ceramics International, Elsevier, Amsterdam, NL, vol. 43, No. 12, Apr. 14, 2017 (Apr. 14, 2017), pp. 8932-8937, XP085042106, ISSN: 0272-8842, DOI: 10.1016/J.CERAMINT.2017.04.031) (Year: 2017).*
(Continued)

*Primary Examiner* — Niki H Nguyen
(74) *Attorney, Agent, or Firm* — Oliff PLC

(57) ABSTRACT

A method of producing a raw material solution for a film-forming according to a Mist CVD method including a temperature at which a solute containing a metallic element is mixed with a solvent and stirred is 30° C. or higher, and a method of film-forming according to the Mist CVD method using a raw material solution produced by the method of producing the raw material solution.

10 Claims, 3 Drawing Sheets

(51) Int. Cl.

| | |
|---|---|
| ***C23C 16/448*** | (2006.01) |
| ***H01L 21/16*** | (2006.01) |
| ***H10P 14/20*** | (2026.01) |
| ***H10P 14/24*** | (2026.01) |
| ***H10P 14/60*** | (2026.01) |
| ***H10P 14/692*** | (2026.01) |

(52) U.S. Cl.

CPC .......... *H10P 14/24* (2026.01); *H10P 14/3434* (2026.01); *H10P 14/6334* (2026.01); *H10P 14/69391* (2026.01)

(58) Field of Classification Search

CPC ............. C23C 16/458; H01L 21/02178; H01L 21/02271; H01L 21/0262; H01L 21/02

See application file for complete search history.

(56) References Cited

U.S. PATENT DOCUMENTS

| | | | | |
|---|---|---|---|---|
| 9,828,694 | B2 | 11/2017 | Oda et al. | |
| 2015/0221506 | A1* | 8/2015 | Fujdala | C07F 19/00 556/27 |
| 2015/0225843 | A1 | 8/2015 | Oda et al. | |
| 2019/0057866 | A1 | 2/2019 | Oshima et al. | |
| 2023/0238432 | A1 | 7/2023 | Hashigami | |

FOREIGN PATENT DOCUMENTS

| | | | |
|---|---|---|---|
| CN | 112652575 | A | 4/2021 |
| JP | H01-257337 | A | 10/1989 |
| JP | 2005-307238 | A | 11/2005 |
| JP | 2005-343727 | A | 12/2005 |
| JP | 2012-046772 | A | 3/2012 |
| JP | 5397794 | B1 | 1/2014 |
| JP | 2014-063973 | A | 4/2014 |
| JP | 2021-031358 | A | 3/2021 |
| TW | 202029285 | A | 8/2020 |
| WO | 2016/027861 | A1 | 2/2016 |

OTHER PUBLICATIONS

Sep. 3, 2024 Office Action issued in Japanese Patent Application No. 2023-518643.

Jun. 28, 2022 International Search Report issued in International Patent Application No. PCT/JP2022/015869.

Oct. 24, 2023 International Preliminary Report on Patentability issued in International Patent Application No. PCT/JP2022/015869.

Oct. 8, 2025 extended Search Report issued in European Patent Application No. 22 798 857.3.

Oh Keun-Tae et al. “Facile synthesis of AlOx dielectrics via mist-CVD based on aqueous solutions”. Ceramics International, vol. 43, pp. 8932-8937, Apr. 14, 2017.

Bu, Y.Y. Ian. “Highly conductive and transparent reduced graphene oxide/aluminum doped zinc oxide nanocomposite for the next generation solar cell applications”. Optical Materials, vol. 36, pp. 299-303, Oct. 3, 2013.

Ghasedi, Arman et al. “Improvement in structural, electrical, and optical properties of Al-doped ZnO nanolayers by sodium carbonate prepared via solgel method”, Applied Physics vol. 474, pp. 1-9, Jun. 2, 2020.

Sep. 15, 2025 Office Action issued in Taiwanese Patent Application No. 111112661.

Jun. 3, 2025 Partial European Search Report issued in European Patent Application No. 22798857.3.

Oh et. al., Facile synthesis of AlOx dielectrics via mist-CVD based on aqueous solutions, Ceramics International, 2017, p. 8932-8937, vol. 43, No. 12.

Bu et. al., “Highly conductive and transparent reduced graphene oxide/aluminium doped zinc oxide nanocomposite for the next generation solar cell applications,” Optical Materials, 2013, p. 299-303, vol. 36, No. 2.

Ghasedi et. al., “Improvement in structural, electrical, and optical properties of Al-doped ZnO nanolayers by sodium carbonate prepared via solgel method,” Applied Physics A, 2020, vol. 126, No. 6.

Dec. 10, 2025 Office Action issued in Korean Patent Application No. 2023-7037463.

Jul. 11, 2026 Office Action issued in Chinese Patent Application No. 202280032175.3.

Aug. 18, 2026 Office Action issued in Taiwanese Patent Application No. 111112661.

Sep. 16, 2026 Office Action issued in Indian Patent Application No. 202347074192.

* cited by examiner

[FIG. 1]
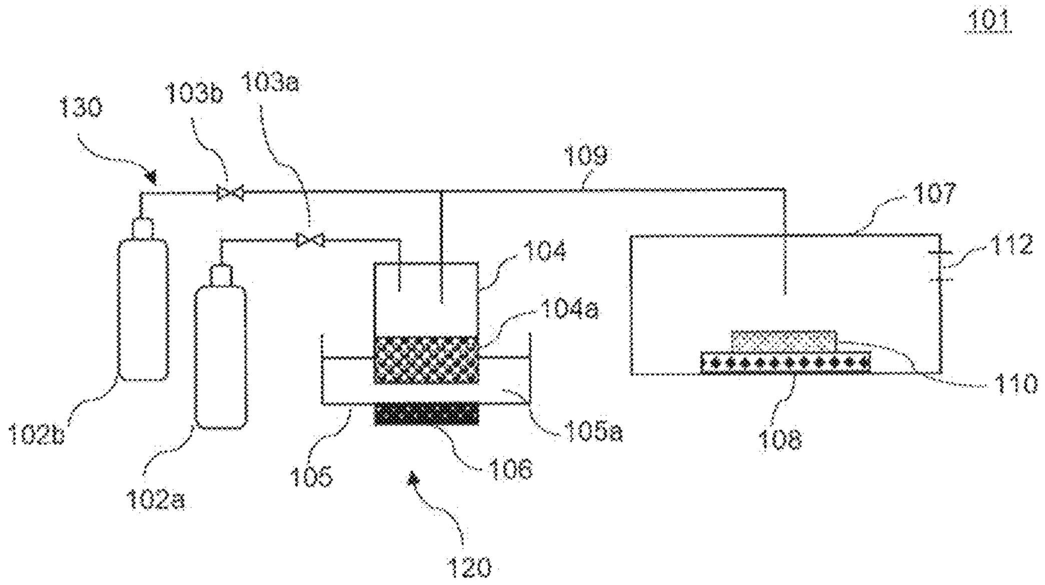
[FIG. 2]
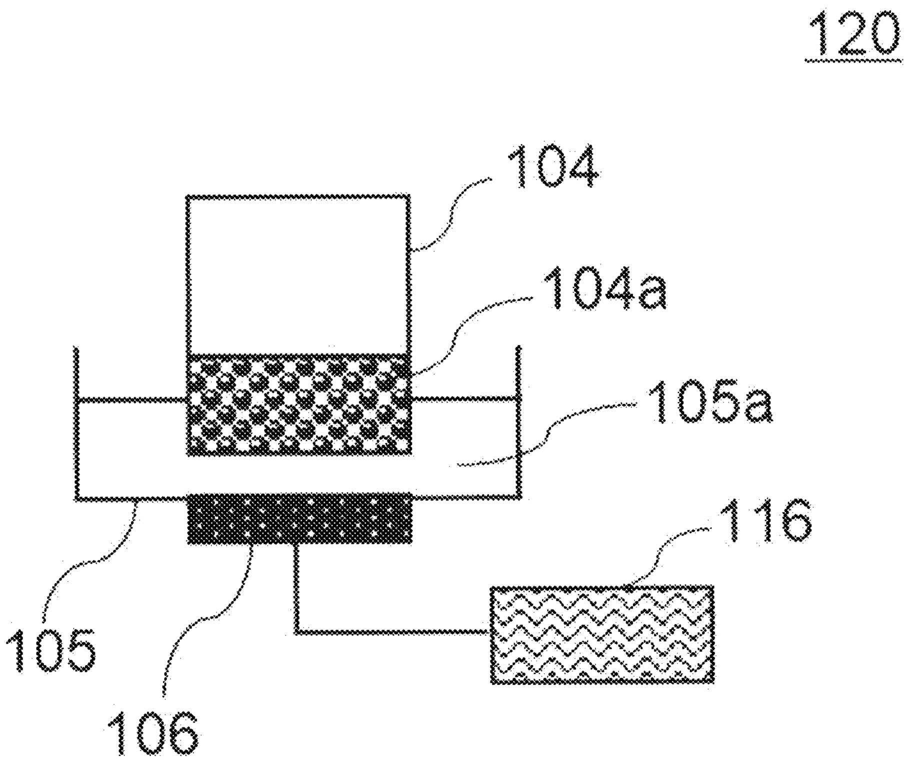

[FIG. 3]
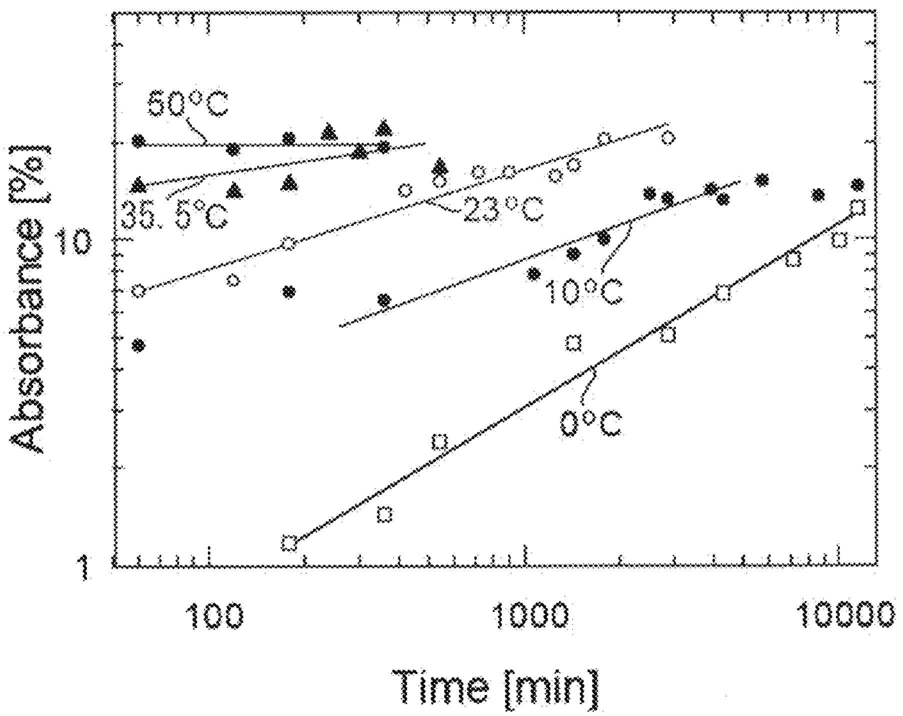
[FIG. 4]
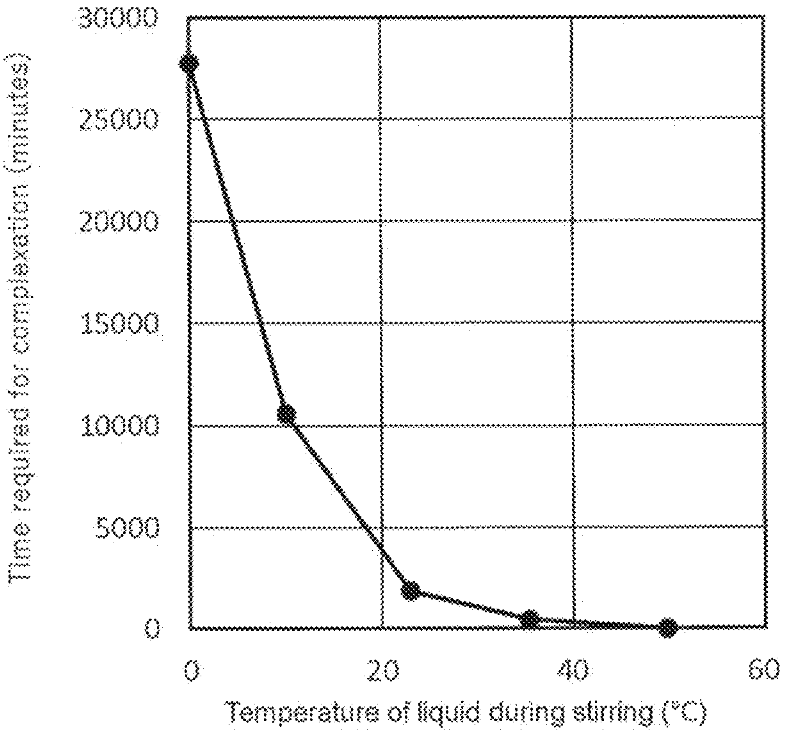

[FIG. 5]
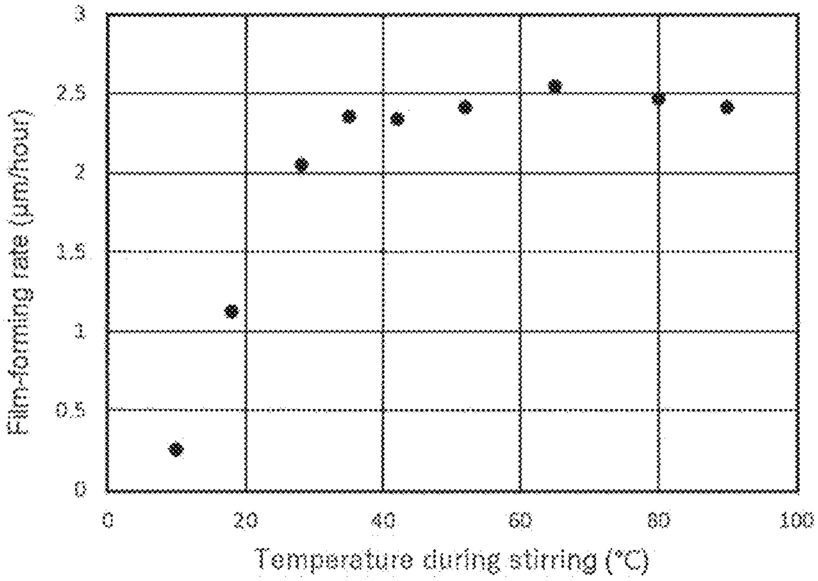

METHOD OF PRODUCING RAW MATERIAL SOLUTION, METHOD OF FILM-FORMING AND PRODUCTION LOT

TECHNICAL FIELD

The present invention relates to a method of producing a raw material solution for film-forming according to a Mist Chemical Vapor Deposition (Mist CVD) method, a method of film-forming according to the Mist CVD method, and a production lot of a crystalline oxide film.

BACKGROUND ART

Conventionally, high vacuum film-forming apparatus capable of realizing a non-equilibrium state such as Pulsed laser deposition (PLD), Molecular beam epitaxy (MBE), and sputtering method has been developed so far. It has become possible to produce oxide semiconductors, which could not be produced by a melt growth method, for example. In addition, a Mist Chemical Vapor Deposition (Mist CVD) method (hereinafter, may be referred to as the "mist CVD method") for growing a crystal on a substrate using an atomized mist-like raw material has been developed. It has become possible to fabricate gallium oxide ($\alpha$-$Ga_2C_3$) having a corundum structure. As a semiconductor with a large bandgap, $\alpha$-$Ga_2O_3$ is expected to be applied to next-generation switching devices capable of achieving high breakdown voltage, low loss, and high heat resistance.

Regarding the mist CVD method, Patent Document 1 discloses a tube furnace-type mist CVD apparatus. Patent Document 2 discloses a fine channel type mist. CVD apparatus. Patent Document 3 discloses a linear source type mist CVD apparatus. Patent Document 4 discloses a mist CVD apparatus for a tube furnace and that is different from the mist CVD apparatus disclosed in Patent Document 1 in which a carrier gas is introduced into a mist-forming unit. Patent Document 5 discloses a mist CVD apparatus in which a substrate is installed above a mist-forming unit and a susceptor is a rotary stage provided on a hot plate.

CITATION LIST

Patent Literature

Patent Document 1: JP H01-257337 A
Patent Document 2: JP 2005-307238 A
Patent Document 3: JP 2012-46772 A
Patent Document 4: JP 5397794 B2
Patent Document 5: JP 2014-63973 A

SUMMARY OF INVENTION

Technical Problem

Unlike other CVD methods, a Mist CVD method does not need high temperature and is capable of producing a crystal structure with a metastable phase such as a corundum structure of $\alpha$-$Ga_2O_3$. Unfortunately, this method is problematic in that film-forming is slow. Moreover, when two or more solid solution elements such as a solid solution of aluminum oxide or indium oxide form a film, there is an issue in which reproducibility of a composition in the film is poor.

The present invention has been made in view of the above-described problem. An object of the present invention is to provide: a raw material solution for film-forming according to the Mist CVD method having an excellent film-forming rate; the method of producing the raw material that enables the film-forming in which the composition in the film has excellent reproducibility, even when the film-forming is performed by two or more solid solution elements; a production lot of crystalline oxide films useful industrially for excellent reproducibility when used as a semiconductor device.

Solution to Problem

To achieve the object, the present invention provides a method of producing a raw material solution for film-forming according to a Mist CVD method including a temperature, at which a solute containing a metallic element is mixed with a solvent and stirred, is 30° C. or higher.

According to such a method of producing the raw material solution, a film-forming by the Mist CVD method enables to increase in the film-forming rate, moreover, even in the case of film-forming of solid solutions containing two or more elements, it is possible to produce the raw material solution that can improve the reproducibility of composition in the film.

The method of producing a raw material solution may include a temperature for the stirring is 35° C. or higher.

Accordingly, the raw material solution can be stably produced, in which the film-forming rate can be further improved and the reproducibility of the composition in the film can be further improved.

The method of producing a raw material solution may include a time for the stirring is 60 hours or less.

Consequently, a process both highly productive and industrially effective can be structured because a composition in a film is stabilized; a reproducibility process is improved; and a raw material solution that enables a film-forming at a high film-forming rate can be produced in a short time.

The method of producing a raw material solution may include the solute containing at least one of the metallic elements of gallium or aluminum, and halogens.

Thus, a raw material solution can be produced, in which a film-forming of gallium oxide or a solid solution containing gallium oxide, or aluminum oxide or a solid solution containing aluminum oxide can be performed at a stable and high film-forming rate.

In this case, the method of producing a raw material solution may include the solute containing at least one of the metallic elements of gallium or aluminum, and acetylacetone is added to the solvent mixed with the solute and stirred.

In consequence, it is possible to produce a raw material solution that can form the film with further improved reproducibility of composition in a film of gallium oxide or a solid solution containing gallium oxide, or aluminum oxide or a solid solution containing aluminum oxide.

In this case, the method of producing a raw material solution may include a temperature for the stirring is 95° C. or lower.

Such a range suppresses an evaporation of a solvent and stabilizes a solute concentration, so a raw material solution can be produced more stably.

In this case, the method of producing a raw material solution may include a time for the stirring is 1 minute or more.

Using this, a process with highly producible and industrially effective can be structured because a raw material solution, which enables a composition in a film stabilized, improves a reproducibility of a process, and enables high film-forming rate of a film-forming, can be produced in a short time.

In this case, a method of film-forming according to a Mist CVD method, comprising the steps of:

generating mist by mist-forming from a raw material solution at a mist-forming unit;

supplying a carrier gas for transporting the mist to the mist-forming unit;

transporting the mist by the carrier gas from the mist-forming unit to a film-forming chamber via a supply pipe connecting the mist-forming unit and the film-forming chamber; and forming a film on a substrate with the transported mist by heat treatment, wherein producing the raw material solution by the method of producing a raw material solution according to the method of producing the raw material solution.

Thus, this allows a film-forming with a high film-forming rate and, in addition, high reproducibility of the composition in the film when a solid solution of two or more elements is formed.

An inventive production lot containing two or more crystalline oxide films, each containing two or more metallic elements, produced from the same raw material solution lot, in which a dispersion in compositions of the metallic elements having the largest composition of a metallic component in the crystalline oxide film among the crystalline oxide films is 5.0% or less.

As a result, a reproducibility is highly excellent and industrially useful when used as a semiconductor device.

In this case, the metallic element contains at least one of gallium or aluminum.

Consequently, it is more suitable as a semiconductor device.

Advantageous Effects of Invention

As described above, according to the inventive method of producing a raw material solution, a solute in the raw material solution is dispersed and homogenized, thus a film-forming rate is greatly improved. In addition, the raw material solution that can form the film by the Mist CVD method with excellent reproducibility of composition in the film and can be produced even when a film-forming of a solid solution containing two or more elements is performed. Furthermore, according to the inventive production Lot, a reproducibility is highly excellent when used as a semiconductor device and the production lot is industrially useful.

BRIEF DESCRIPTION OF DRAWINGS

FIG. 1 is a schematic constitutional view illustrating an example of a film-forming apparatus used in the present invention.

FIG. 2 is a view describing an example of a mist-forming unit used in the present invention.

FIG. 3 is a graph showing experimental results of the time required for the acetylacetonation of aluminum.

FIG. 4 is a graph showing a time required for aluminum acetylacetonate formation to reach saturation.

FIG. 5 is a graph showing a relation between a raw material stirring temperature and a film-forming rate.

DESCRIPTION OF EMBODIMENTS

Hereinafter, the present invention will be described in detail. However, the present invention is not limited thereto.

As described above, a method of producing a raw material solution that enables excellent film-forming rate and excellent reproducibility of the composition in the film even when a solid solution of two or more elements is formed was required. Moreover a production lot of crystalline oxide films useful industrially for excellent reproducibility as a semiconductor device was required.

To solve the above problem, the present inventors have earnestly studied and found a method of producing a raw material solution for film-forming according to a Mist CVD method including a temperature at which a solute containing a metallic element is mixed with a solvent and stirred is 30° C. or higher. Consequently, it is possible to produce the raw material solution that can form the film by the Mist CVD method with an excellent film-forming rate and excellent reproducibility of composition in the film, even when a film-forming of a solid solution containing two or more elements is performed. Thus, the present invention has been completed. Moreover, the present inventors found that a production lot has excellent reproducibility when it is used as a semiconductor device and industrially usefulness, the production lot containing two or more crystalline oxide films, each containing two or more metallic elements, produced from the same raw solution lot and having a dispersion in compositions of the metallic elements having the largest composition of a metallic component in the crystalline oxide film among the crystalline oxide films is 5.0% or less. Thus, the present invention has been completed.

Hereinafter, the present invention is described with reference to the drawings.

Here, a mist according to the present invention refers to a general term of fine particles of liquid dispersed in a gas and includes what is referred to as a fog, a droplet, for example.

(Film-Forming Apparatus)

Firstly, a film-forming apparatus suitably used for an inventive method of film-forming is described. FIG. 1 shows an example of a film-forming apparatus 101. The film-forming apparatus 101 at least includes: a mist-forming unit 120 generating a mist from a raw material solution **104*a* by atomizing into the mist; a carrier gas supply unit 130 supplying carrier gas to transport the mist; a supply pipe 109 connecting the mist-forming unit 120 and a film-forming chamber 107, in which the mist is transported by the carrier gas; and the film-forming chamber 107 performing the heat treatment to mist supplied with the carrier gas from the supply pipe 109 and then forms the film on a substrate 110**.

(Mist-Forming Unit)

In the mist-forming unit 120, the raw material solution **104*a* is atomized into the mist and generates mist. The means for atomizing into the mist is not particularly limited when the raw material solution 104*a*** can be atomized into the mist, may be the publicly known means for atomizing into the mist, but the means for atomizing into the mist by ultrasonic vibrations is preferable. Because this enables more stable atomizing into the mist.

An example of such mist-forming unit 120 is shown in FIG. 2. The mist-forming unit 120 may include: a mist-atomizer 104 in which the raw material solution **104*a* is stored; a container 105 into which a medium capable of transmitting ultrasonic vibrations, such as water 105*a*, can be stored; and an ultrasonic vibrator 106 attached to the bottom of a container 105. In detail, the mist-atomizer 104 is structured as a container, in which the raw material solution 104*a* is stored. The mist-atomizer 104 can be stored with a support member (not shown) in the container 105 containing water 105*a***. Moreover, the ultrasonic vibrator

106 may be connected to an oscillator 116. Additionally, when the oscillator 116 is operated, the ultrasonic vibrator 106 vibrates, and then the ultrasonic waves propagate into the mist-atomizer 104 via the water 105*a*. Consequently, such a mist-forming unit can be configured to atomize the raw material solution 104*a* into the mist. According to the present invention, such a mist-forming unit can configure a mist-forming unit in a mist-forming system described later.

(Carrier Gas Supply Unit)

As shown in FIG. 1, the carrier gas supply unit 130 has a carrier gas source 102*a* to supply carrier gas. In this case, a flow regulating valve 103*a* may be installed to regulate the flow rate of the carrier gas supplied from the carrier gas source 102*a*. Additionally, when it is needed, the unit can also be equipped with a diluent carrier gas source 102*b* to supply dilution carrier gas and a flow regulating valve 103*b* to regulate the flow rate of the dilution carrier gas supplied from the diluent carrier gas source 102*b*.

The type of carrier gas is not particularly limited and can be appropriately selected depending on the film. For example, oxygen, ozone, an inert gas such as nitrogen or argon, or a reducing gas such as hydrogen gas or forming gas can be mentioned. Further, the type of carrier gas may be one type or two or more types. For example, a diluted gas obtained by diluting the same gas as the first carrier gas with another gas (for example, diluted 10-fold) may be further included as the second carrier gas, or air may be included. The flow rate of carrier gas is not particularly limited. For example, when forming a film on a 30 mm square substrate, the flow rate of the carrier gas is preferably 0.01 to 20 L/min, more preferably 1 to 10 L/min.

(Supply Pipe)

The film-forming apparatus 101 has a supply pipe 109 connecting a mist-forming unit 120 and a film-forming chamber 107. In this case, the mist is transported by a carrier gas from a mist-atomizer 104 of a mist-forming unit 120 and then supplied to a film-forming chamber 107 via a supply pipe 109. For example, a quartz tube, a glass tube, or a resin tube can be used as the supply pipe 109. Such a mechanism for transporting the mist including supply pipes can constitute a transporting unit in the film-forming system according to the present invention to be described later.

(Film-Forming Chamber)

In a film-forming chamber 107, a substrate 110 is mounted and a heater 108 to heat the substrate 110 can be installed. The heater 108 may be installed on the inside of the film-forming chamber 107 as shown in FIG. 1 or may be installed outer side the film-forming chamber 107. Additionally, the film-forming chamber 107 may be provided with an exhaust port 112 for exhaust gas at a position that does not affect the supply of mist to the substrate 110. The substrate 110 may be mounted on the top of the film-forming chamber 107, for example, face-down, or the substrate 110 may be mounted on the bottom of the film-forming chamber 107, for example, face-up. Such a mechanism for film-forming including the film-forming chamber can constitute the film-forming chamber of a film-forming system according to the present invention to be described later.

(Substrate)

A substrate is not limited and may be any known substrate when the substrate can form a film thereon or support the film, and the substrate may be an organic compound or an inorganic compound. For example, polysulfone, polyethersulfone, polyphenylene sulphide, polyether ether ketone, polyimide, polyetherimide, fluororesin, metals such as iron, aluminum, stainless steel, and gold, silicon, sapphire, quartz, glass, lithium tantalate, potassium tantalite, lithium niobate, gallium oxide are exemplified but not limited thereto. A thickness of the substrate is not particularly limited but preferably 10 to 2000 μm, and more preferably 50 to 800 μm. The size of the substrate 110 is not particularly limited, the substrate area of 10 $mm^2$ or more, preferably 100 $mm^2$ or more, can be used, or the substrate with a diameter of 2 to 8 inches (50 to 200 mm) or more also can be used.

(Raw Material Solution)

An inventive raw material solution 104*a* is a solution of a mixture of solutes containing at least metallic elements mixed with solvent. A material for the solute contained in the solution is not particularly limited as long as it can be misted and an organic material or an inorganic material may be used. Metals and metal compounds are suitably used, for example, one or more metals selected from gallium, iron, indium, aluminum, vanadium, titanium, chromium, rhodium, nickel, and cobalt may be used. As to such a raw material solution, the metal in the form of a complex or a salt dissolved or dispersed in the solvent, e.g., organic solvent or water, can be suitably used. In addition, in a form of salt, halide salts such as metal chloride salt, metal bromide salt, metal iodide salt, or the like can also be mentioned. A solution of the above metal dissolved in hydrogen halide such as hydrobromic acid, hydrochloric acid or hydroiodic acid as a solvent can also be used as a solution of salt. As a form of the complex, acetylacetonate complexes, carbonyl complexes, ammine complexes, hydride complexes, and the like can be exemplified. Adding acetylacetone into the salt solution and mixing can produce acetylacetonate complex. When the raw material solution is prepared as described above, the raw material solution will contain either halogen or acetylacetone, or both. Incidentally, a concentration of the metal in the raw material solution 104*a* is not particularly limited but may be 0.005 to 1 mol/L, for example.

Furthermore, an addition of ammonium salt of acetylacetone, which is prepared by mixing acetylacetone and ammonia water in advance, also has the same effect as an addition of acetylacetone. The former case can accelerate a reaction, thus preferable.

Additives such as hydrohalic acid and oxidizing agents may be mixed in the raw material solution. As for hydrohalic acid, for example, hydrobromic acid, hydrochloric acid, hydroiodic acid, and the like can be mentioned. Among them, hydrobromic acid and hydroiodic acid are preferable. As examples of oxidizing agents, peroxides such as hydrogen peroxide ($H_2O_2$), sodium peroxide ($Na_2O_2$), barium peroxide ($BaO_2$), benzoyl peroxide $(C_6H_5CO)_2O_2$, and organic peroxides such as hypochlorous acid (HClO), perchloric acid, nitric acid, ozone water, peracetic acid, and nitrobenzene can be mentioned.

Furthermore, the raw material solution may contain a dopant. A dopant is not particularly limited. For example, n-type dopants such as tin, germanium, silicon, titanium, zirconium, vanadium, or niobium, or p-type dopants such as copper, silver, cobalt, iridium, rhodium, magnesium, and Nickel can be mentioned.

(Method of Producing Raw Material Solution)

Then, an inventive method of producing a raw material solution is described. In the inventive method of producing the raw material solution, a solute containing a metallic element is mixed with a solvent and stirred at a temperature of 30° C. or higher. Consequently, this allows the raw material solution to increase the film-forming rate when film-forming is performed by the Mist CVD method. Furthermore, even in the case in which the solid solution containing two or more elements forms the film, the raw material solution capable of improving a reproducibility of a composition of the film can be produced. A stirring temperature at 35° C. or higher can produce the raw material solution with a more stable film-forming rate and the improved reproducibility of composition in the film, thus suitable. The upper limit for the temperature of stirring is preferably 95° C. or lower. In case of such a temperature for stirring, solvent evaporation is suppressed and a solute concentration is stable. A time for stirring is preferably 60 minutes or less, and 1 minute or more is preferable. Consequently, the composition of the film is stabilized and the reproducibility of a process is improved. Moreover, the raw material solution capable of film-forming at a high film-forming rate can be produced, and thus a very efficient process industrially can be constructed. Furthermore, a degradation of productivity can be prevented. Such a mechanism for the method of producing the raw material solution can configure the unit for producing the raw material solution in the film-forming system according to the present invention.

A method and means for stirring is not particularly limited. A stirrer with a heater is suitably usable but a container with a heating and insulating function including the stirrer can realize the stirrer industrially. Moreover, the stirring can be performed by propellors or blades rotating in a stirring container, and can also be performed by using a gas (such as an inert gas or a high-pressure steam) blown in, which does not change in quality of the raw material solution. Moreover, the solution can be circulated externally by a pump aid injected into the container as a jet stream to create a circulating flow for stirring in a tank. Depending on an amount of raw material solution and a stirring time, an operator may conduct stirring by using a stirring rod. Furthermore, stirring methods and means described as examples above can be combined. Such means of stirring can configure means of stirring in a film-formation system according to the present invention.

FIG. 3 shows an experimental result of the formation of aluminum acetylacetonate when an aluminum chloride solution is mixed with acetylacetone at various temperatures and stirred, and then evaluated by the change in absorption of infrared light near 1540 $cm^{-1}$. When the stirring temperature is 50° C., aluminum acetylacetonate is formed and saturated within several minutes. By contrast, the temperature at 23° C., it takes about 30 hours to reach saturation. The time required to reach saturation is read from FIG. 3 and plot against the stirring temperature in FIG. 4. Higher the solution temperature, the time needed shows a more rapid decrease, indicating that a reaction is sufficiently stable and completed within about 15 hours when the stirring temperature is 30° C. or higher. In this case, considering the productivity and stability of the process, a stirring time of 60 hours or less is sufficient. By using the raw material solution that has completed the reaction for the Mist CVD method, the film-forming with excellent reproducibility can be performed stably.

Moreover, at the stirring temperature of 30° C. or lower, an amount of mist generated itself had decreased due to agglomeration of the solute, etc. Making the stirring temperature 30° C. or higher, an effect to improve dispersion of the solute is also obtained. Consequently, it is considered that the amount of generated mist is increased, and the rate of film-forming is improved.

In particular, the solute preferably contains at least one of the metallic elements of gallium or aluminum, and halogens. Thus, in particular, it is possible to produce a raw material solution capable of a stable and higher film-forming rate of gallium oxide or the solid solution containing gallium, oxide, or aluminum oxide or the solid solution containing aluminum oxide.

In addition, it is preferable to use a solute containing at least one of the metallic elements of gallium or aluminum, and to mix the solvent with the solute, add acetylacetone to stir. Consequently, it is possible to produce a raw material solution capable of film-forming with improved reproducibility of the composition in the film of gallium oxide or the solid solution containing gallium oxide, or aluminum oxide or the solid solution containing aluminum oxide, in particular.

(Film-Forming Method)

Hereafter, an example of an inventive method of film-forming is described referring to FIG. 1. A raw material solution 104*a* which is produced by the method above described is stored in a mist-atomizer 104 and then the substrate 110 is mounted on a film-forming chamber 107, and activate a heater 108. Then, the flow regulating valves 103*a* and 103*b* are opened to supply carrier gas from the carrier gas sources 102*a* and 102*b* into the film-forming chamber 107. After the atmosphere in the film-forming chamber 107 is sufficiently purged by the carrier gas, the flow rate of the carrier gas and the flow rate of the carrier gas for dilution are adjusted respectively.

Moreover, as the mist forming step, an ultrasonic vibrator 106 is vibrated, and the vibration is propagated to the raw material solution 104*a* via a water 105*a*, and then the raw material solution 104*a* is atomized into the mist, consequently, the mist is generated.

Furthermore, as a carrier gas supplying step, the carrier gas is supplied to the mist-forming unit 120 to transport the mist.

Moreover, as a transport step, the mist is transported by the carrier gas from mist-forming unit 120 to film-forming chamber 107 via the supply pipe 109 that connects the mist-forming unit 120 and the film-forming chamber 107.

Then, as a film-formation step, the mist transported to the film-forming chamber 107 is performed heat treatment by heating and producing a thermal reaction to form a film on a part of or the entire surface of the substrate 110. The thermal treatment is sufficient when the mist is reacted by heating, and a reaction condition is not particularly limited. The condition can be set appropriately according to raw materials and film-forming materials. For example, a heating temperature is a range from 120° w to 600° C., more preferably can be a range from 200° C. to 600° C., further preferably can be a range from 300° C. to 550° C.

The thermal treatment may be performed under any of a vacuum, non-oxygen atmosphere, reducing gas atmosphere, air atmosphere, or oxygen atmosphere, and may be set according to the film-forming material, appropriately. Moreover, reaction pressuring can be performed at any atmospheric pressure, pressurized or depressurized, the film formation at atmospheric pressure is preferable because an apparatus configuration can be simplified.

(Buffer Layer)

In the film formation described above, a buffer layer can be formed between a film and a substrate, appropriately. Such as $Al_2O_3$, $Ga_2O_3$, $Cr_2O_3$, $Fe_2O_3$, $In_2O_3$, $Rh_2O_3$, $V_2O_3$, $Ti_2O_3$, and $Ir_2O_3$ are suitably used as a material, for the buffer layer. A method of forming the buffer layer is not particularly limited, the film forming can be performed by a publicly known method such as sputtering, and evaporation, but in the case of a Mist CVD method as described above, it is easy to form by simply changing a raw material solution as needed. Specifically, selected from metals including any one or more of aluminum, gallium, chrome, iron, indium, rhodium, vanadium, titanium, and iridium, dissolved or dispersed in water in the form of complexes or salts, can be suitably used as a raw material aqueous solution. The complex forms include acetylacetonate complex, carbonyl complex, ammine complex, and hydride complex, for example. The salt forms include metal chloride salts, metal bromide salts, and metal iodide salts, for example. The above metals dissolved in such as hydrobromic acid, hydrochloric acid, and hydroiodic acid can also be used as salt aqueous solutions. In this case, a solute concentration is preferably 0.005 to 1 mol/L or less, and the stirring temperature for dissolving is set to 30° C. or more. The buffer layer can be formed by setting other conditions in the same way as above. After the buffer layer is film-formed in a predetermined thickness, the film is formed by the inventive method of film-forming. A thickness of the buffer layer is preferably 0.1 μm to 2 μm.

(Heat Treatment after Film-Forming)

In addition, a film obtained by the inventive method of film-forming may be heat treated from 200 to 600° C. Consequently, an unreacted material in the film is removed, and a higher-quality film can be obtained. The heat treatment can be performed in air, an oxygen atmosphere, or an inert gas atmosphere such as nitrogen or argon. The heat treatment time is determined as appropriate and maybe 5 to 240 minutes, for example.

When the film is formed on a substrate, a laminate including the substrate and film is obtained. Then, the substrate can be removed from this laminate using known methods to produce a self-supporting film.

The composition of metal elements described above can be determined by known methods such as atomic emission spectroscopy, mass spectrometry, X-ray photoelectron spectroscopy, secondary ion mass spectrometry, and energy dispersive X-ray fluorescence spectrometer.

The dispersion of the composition of the metal element can be evaluated by the following method. That is to say, for each film obtained by film-forming two or more times under the same conditions, the composition of metal components is determined by a known method, and the value obtained by (maximum value−minimum value)/(maximum value+minimum value)×100(%) is used to evaluate the composition of the metal component using the maximum and minimum values, thus the result is defined as the dispersion. In this context, "the same condition" is actively changeable set values such as a gas flow rate, and the temperature of the film-forming, and as long as these values are identical, the condition can be included in "the same condition" even if uncontrollable factors such as an outside temperature or weather varies. Substrates or materials from the same production lots can be recognized as "the same condition."

By utilizing the method of film-forming, it is possible to produce a production lot that has a plurality of crystalline oxide films in which a dispersion of the metallic elements contained in crystalline oxide films among the crystalline oxide films is small. Specifically, it means the production lot containing 2 or more crystalline oxide films obtained by the raw material solution lot obtained by the inventive method of producing the raw material solution. More specifically, it is possible to produce a production lot containing two or more crystalline oxide films, each containing two or more metallic elements, produced from the same raw solution lot, in which a dispersion in compositions of the metallic elements having the largest composition of a metallic component in the crystalline oxide film among the crystalline oxide films is 5.0% or less. The metallic element preferably contains at least one of metallic element gallium or aluminum.

Such a production lot of the crystalline oxide film can be used as a semiconductor device, for example. Moreover, film can be used as a buffer layer when the semiconductor film is formed. When used for such an application, the reproducibility is excellent and useful industrially.

In the crystalline oxide film of the present invention, a thickness of the film is not particularly limited. For example, the thickness may be 0.05 to 100 μm, preferably 0.1 to 50 μm, further preferably 0.5 to 20 μm.

A size (area) of the crystalline oxide film that can be made is not particularly limited and depends on the size of a film-forming surface of a substrate. The crystalline oxide film of 10 $mm^2$ or preferably 100 $mm^2$ can be obtained.

(Film-Forming System)

Moreover, a film-forming system according to the present invention is described. The film-forming system according to the present invention is the film-forming system that includes a raw material solution-producing unit to produce a raw material solution and a film-forming apparatus above described. In other words, the film-forming system for the crystalline oxide film according to the present invention includes: a raw material solution producing unit to produce the raw material solution for atomizing into a mist which includes a solute containing a metallic element and solvent; a mist-forming unit to make the produced raw material solution atomized into or form into droplets then generate mist; a transporting unit to transport the mist to a film-forming chamber by a carrier gas; and a film-forming chamber to supply the mist from the nozzle to a substrate and perform heat treatment on the substrate to form the film. In addition, the raw material solution-producing unit is provided with a stirring means to stir maintaining a temperature of 30° C. or higher while the solute containing the metallic element and solvent is mixed and stirred. In the film-forming system according to the present invention, the raw material solution-producing unit being controlled by a control unit may produce the raw material solution by mixing and stirring the solute containing metallic element and the solvent at a temperature of 30° C. or higher. Similarly, the film-forming system may be a film-forming system for forming the crystalline oxide films, where each part of the film-forming apparatus, such as a mist-forming unit, a transporting unit, or the film-forming chamber can be controlled by the control unit. With such a control unit, the film-forming system can be made capable of performing the processes described in the method of producing the raw material solution and the method of the film-forming described above.

A means for stirring may be a stirring means makes a stirring temperature 35° C. or higher and 95° C. or lower. In addition, the means for stirring may be a stirring means makes the time for stirring 60 hours or less, and furthermore, the time for stirring of 1 minute or more.

The raw material solution produced at the raw material solution-producing unit may include the solute containing at least one of the metallic elements of gallium or aluminum, and halogens. Moreover, the raw material solution may be the solute containing at least one of the metallic elements of gallium or aluminum. The means for stirring may be a stirring means in such a way that acetylacetone is added to the solvent mixed with the solute, and stir.

EXAMPLE

Hereinafter, the present invention will be specifically described with reference to Examples. However, the present invention is not limited thereto.

Example 1

While referring to FIG. 1, a film-forming apparatus 101 in this example is described. The film-forming apparatus 101 included the following components:

- a carrier gas source 102*a* supplying a carrier gas;
- a flow regulating valve 103*a* for regulating a flow rate of the carrier gas supplied from the carrier gas source 102*a;*
- a diluent carrier gas source 102*b* supplying a diluent carrier gas;
- a flow regulating valve 103*b* for regulating a flow rate of a diluent carrier gas supplied from the diluent carrier gas source. 1.02*b;*
- a mist-atomizer 104 containing a raw material solution 104*a;*
- a container 105 containing water 105*a;*
- an ultrasonic vibrator 106 attached to the bottom surface of the container 105;
- a film-forming chamber 107 being installed a heater 108; and
- a supply pipe 109 made of quarts, which connects the mist-atomizer 104 and the film-forming chamber 107.

(Raw Material Solution)

The raw material solution was produced as follows. An ultrapure water as a solvent and a gallium bromide as a solute were mixed and then stirred for 10 minutes maintaining a liquid temperature at 52° C. by heating using a heater. A gallium concentration was 0.1 mol/L and is used as the raw material solution 104*a*.

(Substrate)

A c-plane sapphire substrate with a square shape sliced with one side 3 cm as substrate 110 was mounted in the film-forming chamber 107 and the heater 108 was activated to raise a temperature to 500° C.

(Film-Forming)

The raw material solution 104*a* obtained as described above was stored in mist-atomizer 104. Then flow regulating valves 103*a* and 103*b* were opened and supplied a carrier gas from carrier gas sources 102*a* and 102*b* into a film-forming chamber 107. After an atmosphere in the film-forming chamber 107 was sufficiently purged with the carrier gas, the flow rate of the carrier gas was adjusted to 2 L/min and the flow rate of a diluent carrier gas was adjusted to 6 L/min, respectively. Nitrogen was used as the carrier gas.

Then, an ultrasonic vibrator 106 was vibrated at 2.4 MHz, the vibration was propagated to the raw material solution 104*a* via water 105*a*, and then a mist was formed by atomizing the raw material solution 104*a*. The mist was introduced into the film-forming chamber 107 by the carrier gas via a supply pipe 109. Furthermore, a thin film of gallium oxide was formed on a substrate 110 by a thermal reaction of the mist in the film-forming chamber 107 at 500° C. under atmospheric pressure. The time for film formation was 30 minutes.

(Evaluation)

The thin film formed on the substrate 110 was confirmed by x-ray diffraction that $\alpha$-$Ga_2O_3$ was formed. Then, a thickness of the film was measured by Optical Interference Thickness Meter F-50 from FILMETRICS, Inc. Nine measurement points on a surface area on the substrate 110 were used to calculate an average thickness. As a result, the average thickness was 1.2 μm and a film-forming rate was 2.4 μm/hour.

Examples 2 to 6

A stirring temperature was set to 35, 42, 65, 80, and 90° C. respectively when a solute was mixed into a solvent and stirred, other conditions were the same as Example 1. Then films were formed and evaluated. As a result, the average thickness was 1.2, 1.2, 1.3, 1.2, 1.2 μm in that order, and the film-forming rate was 2.4, 2.3, 2.5, 2.5, 2.4 μm/hour in that order.

Comparative Examples 1 to 3

The stirring temperature was set to 10, 18, and 28° C. respectively and other conditions were the same as Example 1. Then films were formed and evaluated. As a result, the average thickness was 0.1, 0.6, and 1.0 μm in that order, and the film-forming rate was 0.3, 1.1, and 2.0 μm/hour in that order.

A graph summarizing the film-forming rates from Examples 1 to 6 and Comparative Examples 1 to 3 is shown in FIG. 5. When the stirring temperature is 30° C. or higher, the film-forming rate is generally constant regardless of the stirring temperature, indicating stable and sufficiently high film-forming rate. This is considered due to a reaction of the solute tend to proceed easily and a concentration of the solute is stabilized after the reaction. By contrast, a low stirring temperature is considered to form agglomeration in the solution thus decreasing an amount of generated mist.

Example 7

Gallium chloride and aluminum chloride were weighed at a molar ratio of 3:7 and mixed into ultrapure water. A total concentration of a solute was set to 0.02 mol/L. Then 0.06 mol/L of acetylacetone was mixed into this solute. A resulting mixture was stirred for 10 minutes at a temperature of 50° C. and the raw material solution was produced. Other than this, a film was formed as same as Example 1. An $\omega$-$2\theta$ scan by an X-ray diffractometer showed that a peak appeared between an $\alpha$-$Ga_2O_3$ and $Al_2O_3$ peak positions, indicating that a solid solution of $Ga_2O_3$ and $Al_2O_3$ was obtained. A similar experiment was conducted again and the peak in the X-ray diffraction appeared at the same position indicating that a reproducibility of a film composition is excellent.

Example 8

Under the same condition as Example 7, a film forming was repeated five times and produced five production lots containing crystalline oxide films. Compositions of $(AlGa)_2O_3$ films obtained from a resulting production lot were determined by an energy dispersion type fluorescence X-ray spectrometry using Scanning Electron Microscope (JSM-IT200) from JEOL Ltd. As a result, compositions of Ga were 82, 80, 80, 81, and 79%, respectively and the dispersion of a composition of Ga is 1.9%, with very good reproducibility.

Example 9

A film-forming was repeated five times under the same conditions as in Example 7, except that a molar ratio of gallium chloride to aluminum chloride was 1:9, and a product lot was produced. Compositions of $(AlGa)_2O_3$ films in production lots obtained were determined by the same method as in Example 8. As a result, compositions of Ga were 54, 53, 49, 49, and 50%, respectively and the dispersion of a composition of Ga is 4.9%, with very good reproducibility.

Comparative Example 4

A film-forming was repeated five times under the same conditions as in Example 9, except that a temperature at stirring is 28° C., and a product lot was produced. Compositions of $(AlGa)_2O_3$ films in production lots obtained were determined by the same method as in Example 8. As a result, compositions of Ga were 53, 59, 48, 57, and 52%, respectively and the dispersion of a composition of Ga was 10.3%, and reproducibility was worsened.

As described above, according to Examples of the present invention, a raw material solution with an excellent film-forming rate was successfully produced, moreover, even when a solid solution containing two or more elements was formed, the raw material solution capable of the film-forming with an excellent reproducibility of composition in the film was successfully produced.

It should be noted that the present invention is not limited to the above-described embodiments. The embodiments are just examples, and any examples that have substantially the same features and demonstrate the same functions and effects as those in the technical concept disclosed in claims of the present invention are included in the technical scope of the present invention.

The invention claimed is:

1. A method of producing a raw material solution for film-forming according to a Mist Chemical Vapor Deposition (Mist CVD) method, wherein a temperature at which a solute containing a metallic element is mixed with a solvent and stirred is 30° C. or higher, and wherein the solute contains at least the metallic element of gallium and halogens.

2. The method of producing a raw material solution according to claim 1, wherein a temperature for the stirring is 35° C. or higher.

3. The method of producing a raw material solution according to claim 1, wherein a time for the stirring is 60 hours or less.

4. The method of producing a raw material solution according to claim 2, wherein a time for the stirring is 60 hours or less.

5. The method of producing a raw material solution according to claim 1, wherein acetylacetone is added to the solvent mixed with the solute and stirred.

6. The method of producing a raw material solution according to claim 1, wherein a temperature for the stirring is 95° C. or lower.

7. The method of producing a raw material solution according to claim 1, wherein a time for the stirring is 1 minute or more.

8. A method of film-forming according to Mist CVD method, comprising the steps of:

generating mist by mist-forming from a raw material solution at a mist-forming unit;

supplying a carrier gas for transporting the mist to the mist-forming unit;

transporting the mist by the carrier gas from the mist-forming unit to a film-forming chamber via a supply pipe connecting the mist-forming unit and the film-forming chamber; and forming a film on a substrate with the transported mist by heat treatment, wherein producing the raw material solution by the method of producing a raw material solution according to claim 1.

9. A production lot containing two or more crystalline oxide films, each containing two or more metallic elements, produced from the same raw solution lot, wherein a dispersion in compositions of the metallic elements having the largest composition of a metallic component in the crystalline oxide film among the crystalline oxide films is 5.0% or less.

10. The production lot according to claim 9, wherein the metallic element contains at least one of gallium or aluminum.

* * * * *